United States Patent
Segev

(10) Patent No.: US 10,734,340 B2
(45) Date of Patent: Aug. 4, 2020

(54) HEIGHT MEASUREMENTS OF CONDUCTIVE STRUCTURAL ELEMENTS THAT ARE SURROUNDED BY A PHOTORESIST LAYER

(71) Applicant: CAMTEK LTD., Migdal Haemek (IL)

(72) Inventor: Eyal Segev, Migdal Haemek (IL)

(73) Assignee: CAMTEK LTD., Midal Haemek, IL (US)

( * ) Notice: Subject to any disclaimer, the term of this patent is extended or adjusted under 35 U.S.C. 154(b) by 0 days.

(21) Appl. No.: 16/405,991

(22) Filed: May 7, 2019

(65) Prior Publication Data
US 2019/0355688 A1 Nov. 21, 2019

Related U.S. Application Data

(60) Provisional application No. 62/671,469, filed on May 15, 2018.

(51) Int. Cl.
| | | |
|---|---|---|
| H01L 21/00 | (2006.01) | |
| H01L 23/00 | (2006.01) | |
| H01L 21/66 | (2006.01) | |
| G01B 11/06 | (2006.01) | |

(52) U.S. Cl.
CPC .......... H01L 24/11 (2013.01); G01B 11/0625 (2013.01); H01L 22/12 (2013.01); *H01L 2224/117* (2013.01); *H01L 2224/1146* (2013.01); *H01L 2224/11618* (2013.01)

(58) Field of Classification Search
None
See application file for complete search history.

(56) References Cited

U.S. PATENT DOCUMENTS

| | | | | |
|---|---|---|---|---|
| 6,100,985 | A  * | 8/2000 | Scheiner | G01B 11/02 250/341.1 |
| 6,563,586 | B1 * | 5/2003 | Stanke | B24B 49/12 257/E21.53 |
| 9,728,470 | B1 * | 8/2017 | Heider | H01L 29/2003 |
| 2014/0307262 | A1 * | 10/2014 | Kato | H01L 22/12 356/451 |
| 2015/0092201 | A1 * | 4/2015 | Ghosh | G01B 11/0625 356/630 |
| 2015/0219440 | A1 * | 8/2015 | Kim | G01B 11/0625 356/630 |

(Continued)

OTHER PUBLICATIONS

"Stereo Vision Based Automated Solder Ball Height Detection" by Li et al. (Year: 2014).*

*Primary Examiner* — Evren Seven
(74) *Attorney, Agent, or Firm* — Reches Patent

(57) ABSTRACT

A method for estimating a thickness related to multiple conductive structural elements of an object, the method includes estimating a height difference between an upper surface of a conductive structural element and an upper surface of a photoresists layer portion that surrounds the conductive structural element, to provide multiple height differences; estimating thicknesses of the multiple photoresists layer portions, based at least on the second part of the emitted radiation; and calculating thickness values related to the multiple conductive structural elements, wherein the calculating is based at least on the multiple height differences and on the estimated thickness of the multiple photoresists layer portions.

20 Claims, 8 Drawing Sheets

(56) References Cited

U.S. PATENT DOCUMENTS

| | | | |
|---|---|---|---|
| 2017/0059303 A1* | 3/2017 | May | G01B 11/0625 |
| 2017/0221739 A1* | 8/2017 | Hung | G01B 11/0625 |
| 2018/0108578 A1* | 4/2018 | Pandev | H01L 22/12 |
| 2018/0226283 A1* | 8/2018 | Amanullah | G06T 7/0004 |
| 2019/0310074 A1* | 10/2019 | Masumoto | H01L 22/12 |
| 2019/0348384 A1* | 11/2019 | Okuzono | G06T 7/001 |

* cited by examiner

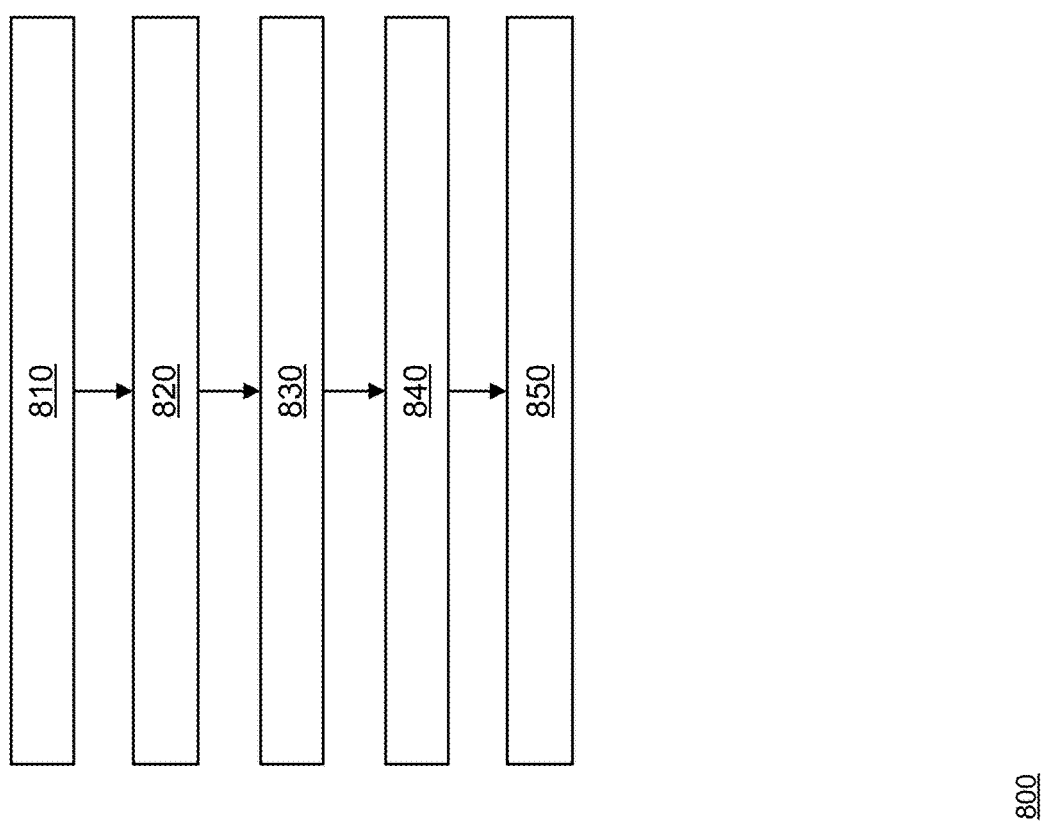

HEIGHT MEASUREMENTS OF CONDUCTIVE STRUCTURAL ELEMENTS THAT ARE SURROUNDED BY A PHOTORESIST LAYER

CROSS REFERENCE

This application claims priority from U.S. provisional patent Ser. No. 62/671,496 filing date May 15, 2018 which is incorporated herein by reference.

BACKGROUND

Conductive structural elements such as bumps and/or pillars may be surrounded by a photoresist layer.

There is a growing need to accurately and efficiently measure the thickness of the conductive structural elements.

BRIEF DESCRIPTION OF THE INVENTION

The present invention will be understood and appreciated more fully from the following detailed description taken in conjunction with the drawings in which:

FIG. 8 illustrates an example of a method.

DETAILED DESCRIPTION OF THE INVENTION

Because the apparatus implementing the present invention is, for the most part, composed of optical components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

There may be provided a method and a system for estimating a thickness of conductive structural elements that are formed in voids or trenches of a photoresist layer.

The method is not limited to wafers—it can apply to any kind of semiconductor objects or other objects that include bumps and/or pillars, etc. The bumps and/or pillars may be of millimetric till microscopic scale.

Figure 1:
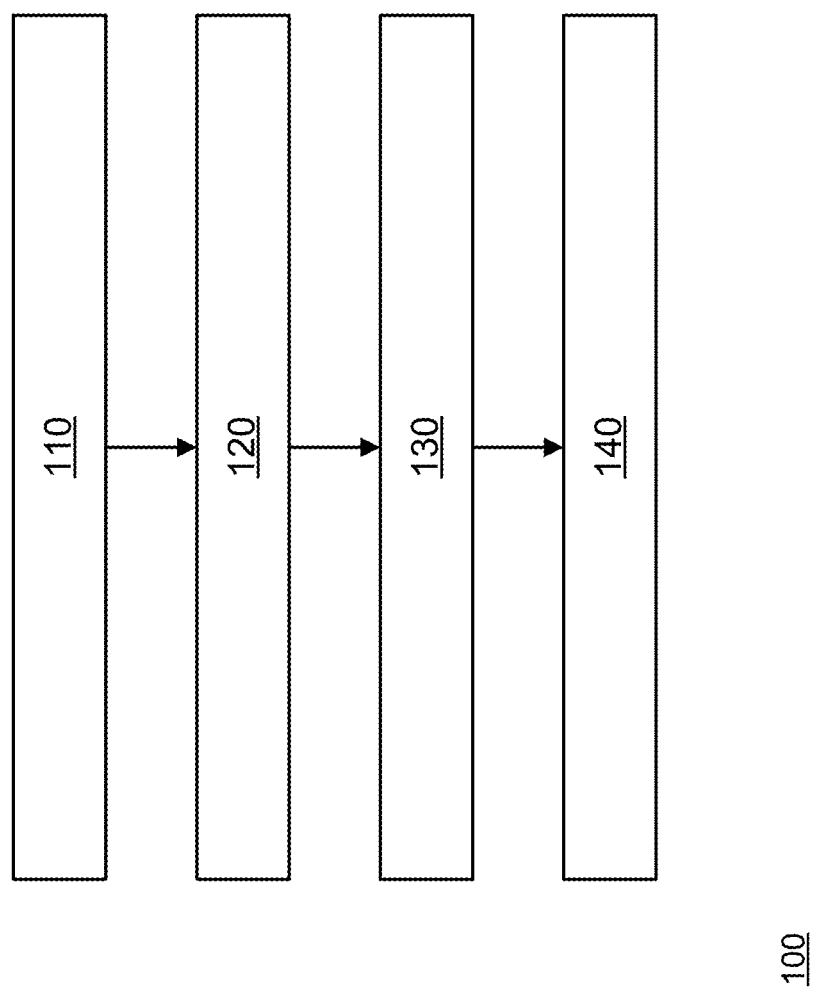
FIG. 1 illustrates an example of a method.

FIG. 1 illustrates an example of method 100.

Method 100 may include steps 110, 120,130 and 140.

Step 110 may include measuring—for each conductive structural element out of multiple conductive structural elements—a height difference between the conductive structural element and a photoresist region that surrounds the conductive structural element.

The multiple conductive structural elements may be all the conductive structural elements of a die, all the conductive structural elements of a wafer, only some of the conductive structural elements of the die, or only some of the conductive structural elements of the wafer.

The height of a conductive structural element may be regarded as the height of a top of the conductive structural element. Alternatively—the height may take into account heights of points of the conductive structural element that are necessarily the top of the conductive structural element.

The step 110 may be used to inspect 100% of the object surface for providing height measurements of the conductive structural elements located anywhere in the whole of the object. In addition, a user or any other party may determine which conductive structural elements should be measured in step 110 for their height measurements. Thus, step 110 may include providing height measurements of only some of the conductive structural element of the object.

Step 110 may be executed by a height measurement system that may or may not be a triangulation system.

A non-limiting example of a triangulation system is illustrated, for example, in U.S. Pat. Nos. 8,363,229, 9,756, 313, 9,759,555.

Other triangulation systems and height measurements systems that differ from triangulation systems may be used.

For example—height measurements systems that execute at least step 110 may include laser based triangulation systems that scans the multiple conductive layers and the areas of the photoresists that surround the multiple conducive layers.

The height measurement (for example scanning) can be done by illuminating at least the conductive structural element by radiation that does not penetrate the photoresist layer. For example—one or more ultraviolet (UV) beams may be used.

The triangulation may be very quick and accurate.

For example—using a triangulation system such as Camtek Triangulation sensor (CTS) that is configured to illuminate the photoresist layer and the conductive structural elements with a UV beam.

The CTS is fast and accurate- and may be used to accurately measure the heights of each of the multiple conductive structural element and the heights of areas of the photoresist layer that surround the multiple conductive structural element—and calculate the height difference by comparison between the heights of the areas of the photoresists layers and the heights of the conductive structural elements.

Step 120 may include measuring the thickness of the photoresist layer at a plurality of locations (sampling) using layer thickness sensors such as but not limited to reflectometer.

The thickness measurements are slower (per single measurement) than the CTS measurements—and thus sample multiple locations but do not measure the thickness of each pixel of the photoresist layer.

Such sampling points of multiple locations may be evenly dispersed over the object. Such samplings points could be for example fifty different points on the object or on the inspected die, instead of millions fast-measured heights of bumps during step 110.

A user or any other party may determine which conductive structural elements should be measured in step 120 for their layer thickness measurements.

The plurality of thickness measurements can be used to estimate (for example by extrapolation, interpolation and the like) the thickness of each area that surrounds each conductive structural element.

Figure 4:
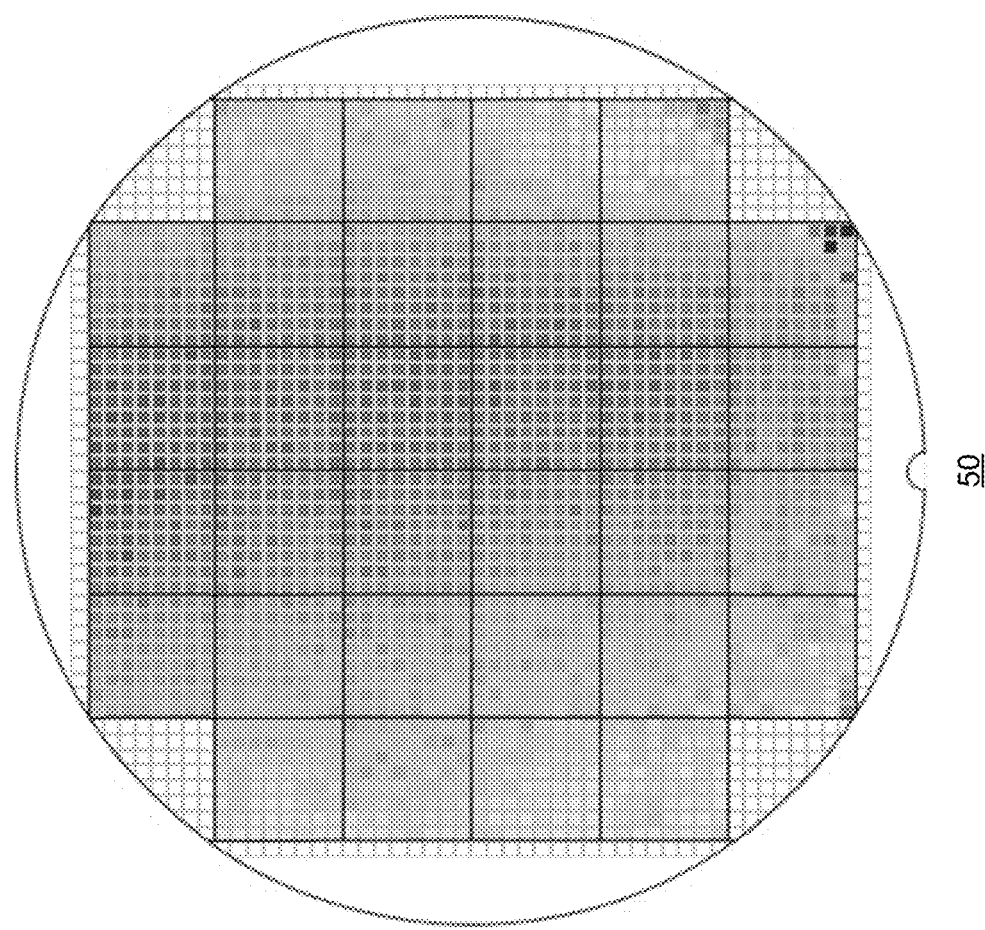
FIG. 4 is an example of a height map.

Step 120 may include producing an estimated height map of the photoresist layer. See for example map 50 of FIG. 4. Different colors (gray levels) represents different heights of the photoresist layer. This step may include calculation of weighted average of the height measurements—that may be instead of producing a height map.

Step 130 may include calculating the thickness of each conductive structural element of the multiple conductive structural elements based on the outcome of step 110 and of step 120.

In cases (for example in conductive pillars) where the top of the conductive structural element is lower than the top of the photoresist layer—step 130 may include calculating the thickness of each conductive structural element by subtracting the (i) height difference between the area of the photoresist layer that surrounds the conductive structural element and the conductive structural element from (ii) the thickness of the area of the photoresist layer that surrounds the conductive structural element.

Figure 2:
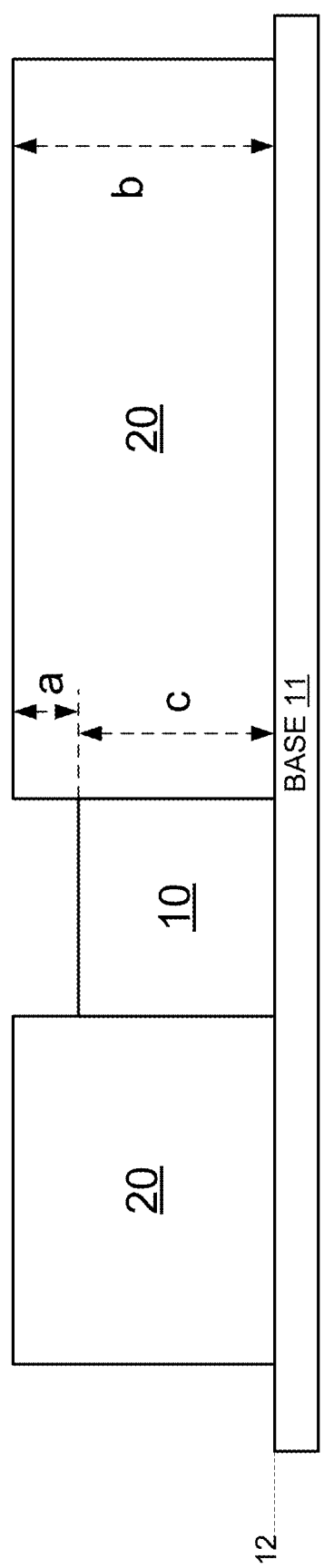
FIG. 2 illustrates an example of a pillar plating that is surrounded by an area of a photoresist layer.

See, for example—FIG. 2 where pillar 10 is surrounded by photoresist layer 20. The thickness (c) of the pillar equals the thickness (b) of the photoresist layer (at the area that surrounds the pillar) minus the height difference (a) between the top of the photoresist layer (at the area that surrounds the pillar) and the top of the pillar. The thickness (b) is calculated during step 120. The height difference (a) is calculated during step 110.

In cases (for example in bumps) where the top of the conductive structural element is higher than the top of the photoresist layer—the thickness of each conductive structural elements is calculated by adding the (i) height difference between the area of the photoresist layer that surrounds the conductive structural element and the conductive structural elements to (ii) the height of the area of the photoresist layer that surrounds the conductive structural element.

Figure 3:
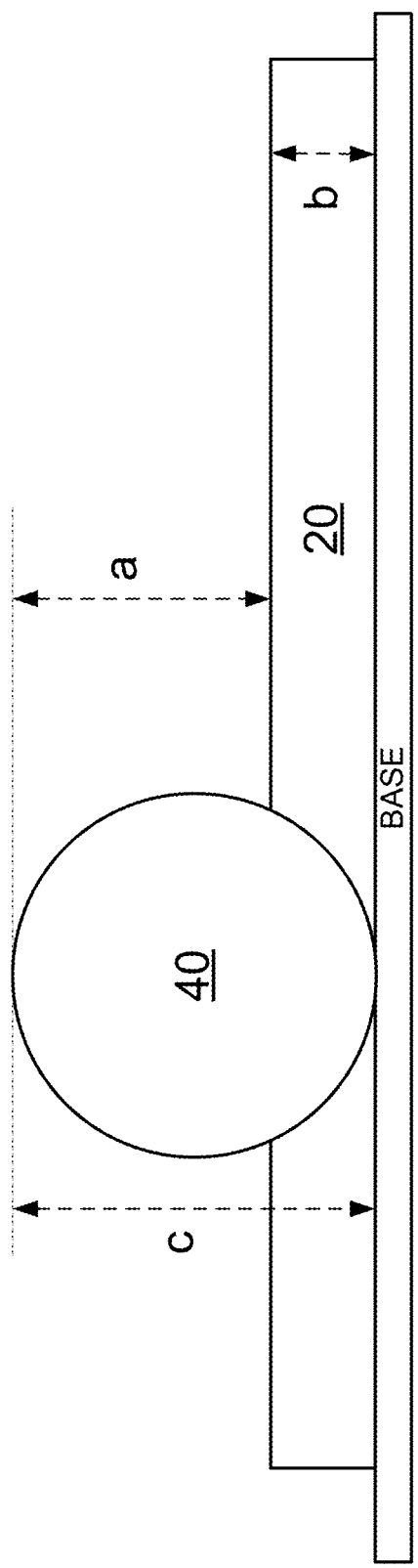
FIG. 3 illustrates an example of a bump that is surrounded by an area of a photoresist layer.

See, for example—FIG. 3 where bump 40 is surrounded by photoresist layer 20 but extends outside the photoresist layer. The thickness (c) of the bump equals the thickness (b) of the photoresist layer (at the area that surrounds the bump) plus the height difference (a) between the top of the photoresist layer (at the area that surrounds the bump) and the top of the bump. The thickness (b) of the photoresist layer is calculated during step 120. The height difference (a) is calculated during step 110.

Method 100 may also include step 140 of responding to the outcome of step 130. For example—step 140 may include providing an indication about the quality of the conductive structural elements (or of the quality of the manufacturing process of the conductive structural elements), generating an alert when the heights of the conductive structural elements deviate from the allowed range, and the like. Step 140 may include performing any process control measure.

Figure 5:
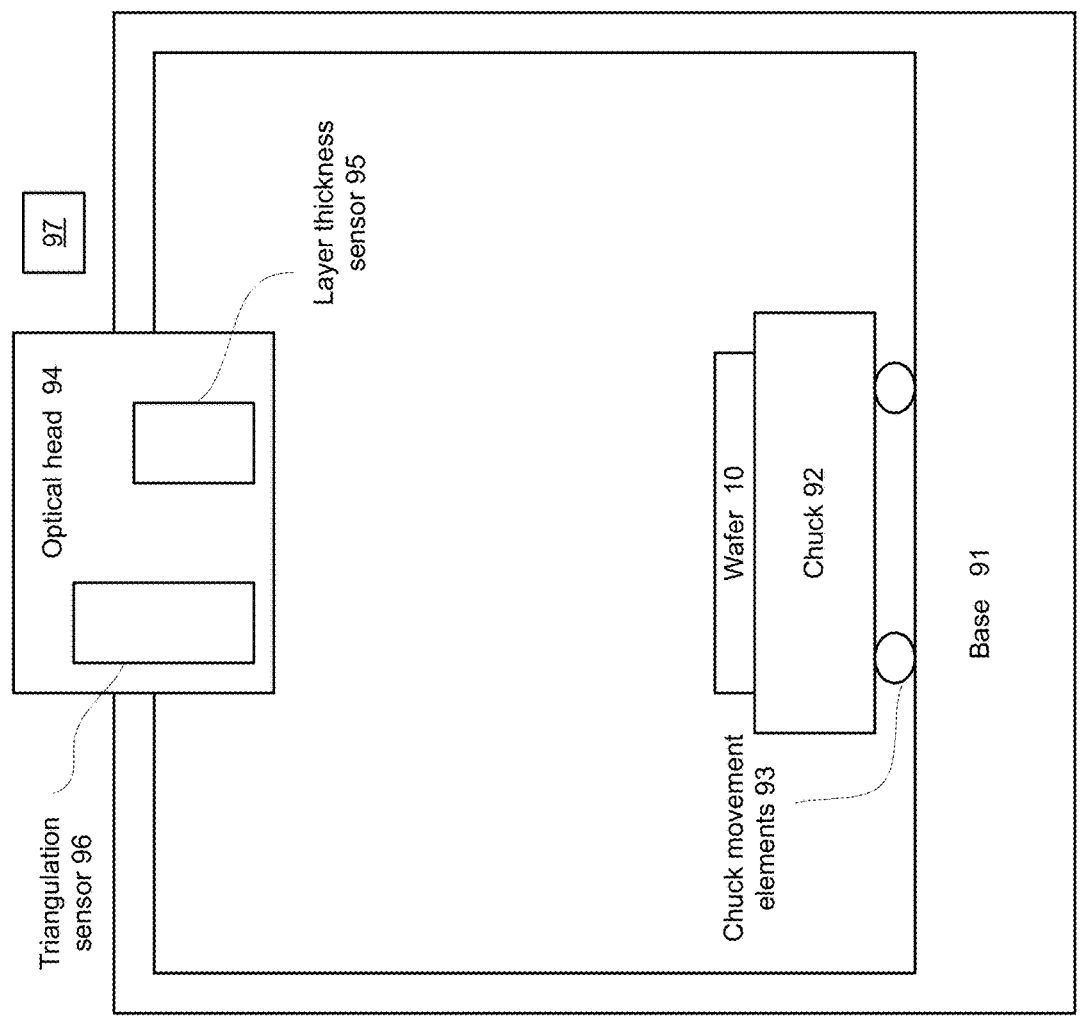
FIG. 5 is an example of a system.

FIG. 5 illustrates an example of a system 90 that includes an acquisition module (such as an optical head 94) that may move along the Z axis.

The acquisition module may include a triangulation sensor 96, a layer thickness sensor 95 or interferometer, a chuck 92 that supports a wafer 10, a chuck movement elements 93 for moving the chuck, (movement may be, for example at any direction), base 91 and one or more processing circuits.

The one or more processing circuits may include one or more integrated circuits, one or more graphical processing units (GPUs), one or more central processing units (CPUs), one or more application specific integrated circuits (ASICs), one or more field programmable gate arrays (FPGAs), and the like.

System 90 may also include another sensor (such as but not limited to a camera).

FIG. 5 is a non-limiting example of a system that may include a first measurement unit, a second measurement unit and one or more processing circuit. The one or more processing circuit may be included in one or both measurements units, or may be located outside either one of the measurement units.

The first measurement unit may include the triangulator sensor 96. The second measurement unit may include the layer thickness sensor 95.

The first measurement unit may be configured to: (i) illuminate, with first illuminating radiation, the multiple conductive structural elements and multiple photoresist layer portions that belong to a photoresist layer of the object; wherein the multiple photoresists layer portions surround the multiple conductive elements; (ii) detect first emitted radiation, wherein the first emitted radiation is emitted from upper surfaces of the multiple photoresists layer portions and is emitted from upper surfaces of the multiple conductive structural elements; and (iii) estimate, for each conductive structural element and based on the first emitted radiation, a height difference between an upper surface of the conductive structural element and an upper surface of a photoresists layer portion that surrounds the conductive structural element, to provide multiple height differences The second measurement unit may be configured to (i) illuminate with second illuminating radiation a first plurality of points of the photoresist layer portions; wherein the second illuminating radiation differs by at least wavelength from the first illuminating radiation; (ii) detect second emitted radiation that is emitted from at least bottoms of the multiple photoresists layer portions; and (iii) estimate thicknesses of the multiple photoresists layer portions, based at least on the second emitted radiation.

The one or more processing circuits may be configured to calculate thickness values related to the multiple conductive structural elements, wherein the calculating is based at least on the multiple height differences and on the estimated thickness of the multiple photoresists layer portions.

Any type of illumination and/or detection may be used.

Figure 6:
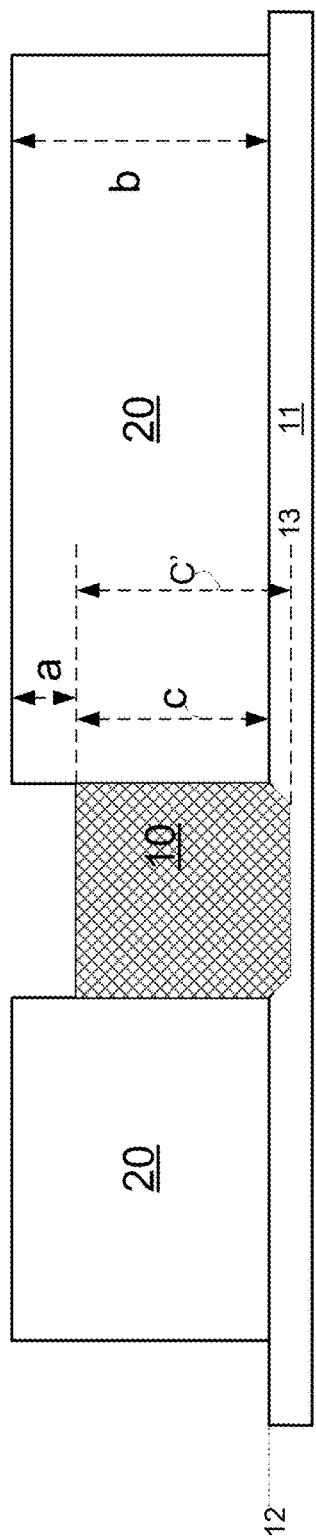
FIG. 6 illustrates different measurements of thicknesses.

FIG. 6 illustrates an inaccurate measurement (denoted a) obtained during step 110 (top of page) and an accurate measurement (denoted b) taken during step 120 (bottom of page). FIG. 6 also illustrates two possible thickness measurements c and c' of conductive structural element 10.

Figure 7:
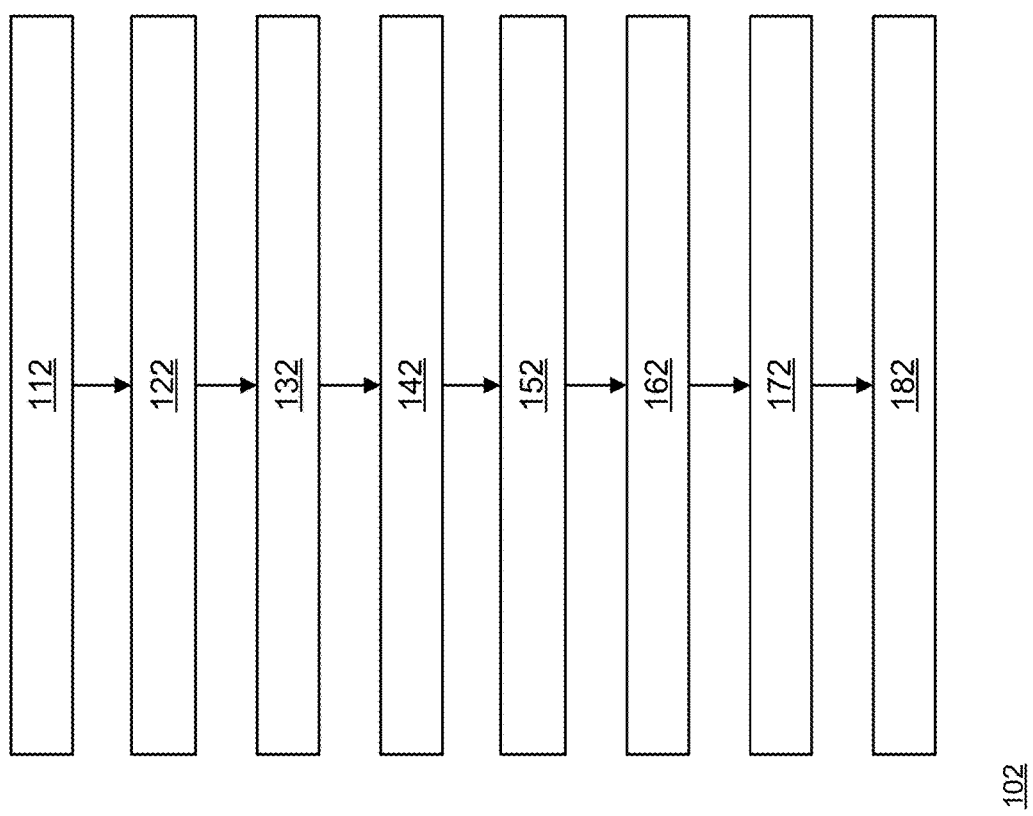
FIG. 7 illustrates an example of a method.

FIG. 7 illustrates method 102. Method 102 is for estimating a thickness related to multiple conductive structural elements of an object.

Method 102 may include steps 112, 122, 132, 142, 152, 162, 172 and 182.

Step 112 may include illuminating, with first illuminating radiation, the multiple conductive structural elements and multiple photoresist layer portions that belong to a photoresist layer of the object; wherein the multiple photoresists layer portions surround the multiple conductive elements.

Step 122 may include detecting first emitted radiation, wherein the first emitted radiation is emitted from upper surfaces of the multiple photoresists layer portions and is emitted from upper surfaces of the multiple conductive structural elements.

Step 132 may include estimating, for each conductive structural element and based on the first emitted radiation, a height difference between an upper surface of the conductive structural element and an upper surface of a photoresists layer portion that surrounds the conductive structural element, to provide multiple height differences.

Step 142 may include illuminating with second illuminating radiation a first plurality of points of the photoresist layer portions; wherein the second illuminating radiation differs by at least wavelength from the first illuminating radiation.

Step 152 may include detecting second emitted radiation that is emitted from at least bottoms of the multiple photoresists layer portions.

Step 162 may include estimating thicknesses of the multiple photoresists layer portions, based at least on the second emitted radiation.

Step 172 may include calculating thickness values related to the multiple conductive structural elements, wherein the calculating is based at least on the multiple height differences and on the estimated thickness of the multiple photoresists layer portions.

Step 182 may include responding to the outcome of step 172. For example—step 182 may include providing an indication about the quality of the conductive structural elements (or of the quality of the manufacturing process of the conductive structural elements), generating an alert when the heights of the conductive structural elements deviate from the allowed range, and the like. Step 182 may include performing any process control measure.

The first illuminating radiation may be an ultraviolet radiation.

The first illuminating radiation may not propagate through the photoresist layer. This allows steps 112, 122 and 132 to obtain measurements regarding the top surface of the photoresist layer and prevent from introducing height measurement error resulting from unwanted propagation of radiation within the photoresist layer.

The second illumination radiation may propagate through the photoresist layer.

Steps 142, 152 and 162 may be executed by a reflectometer.

Steps 112, 122 and 132 may be executed by a device that differs from the reflectometer.

Steps 112, 122 and 132 may be executed by a first process and steps 142, 152 and 162 may be executed by a second process.

Per measurement, the first process may be faster than the second process. A single measurement may be, for example, a measurement of the thickness of the photoresist layer at a single point, a height different measurement between a single conductive structural elements and a photoresist layer portion that surrounds the conductive structural element.

The multiple conductive structural elements may be a second plurality of conductive structural elements, and wherein the second plurality exceeds the first plurality. Thus—the thickness measurements of the photoresist layer is executed in less locations than the height difference measurements.

At least one of the multiple photoresists layer portions may not include any of the first plurality of points.

The bottoms of the multiple photoresists layer portions, bottoms of the multiple conductive structural elements may be located at a same plane (see first plane 12 of FIG. 2), and wherein the thickness values related to the multiple conductive structural elements represent thickness of the entire multiple conductive structural elements.

The bottoms of the multiple photoresists layer portions may be located at a first (see first plane 12 of FIG. 6) plane, bottoms of the multiple conductive structural elements may be located at a second plane (see second plane 13 of FIG. 6) that differs from the first plane, and wherein the thickness values (for example when measuring c') is related to the multiple conductive structural elements represent thickness of parts of the multiple conductive structural elements.

As can be seen from FIG. 6, the height differences and the thickness of the photoresist layer may provide an indication of a thickness (denoted c) of the conductive structural element 10—as measured between the top of conductive structural element 10 till first plane 12.

Assuming the height difference between first plane 12 and second plane 13 is known—the outcome of method 100 and/or method 102 may be the thickness of the conductive structural element 10 as measured between the upper surface of the conductive structural element 10 and the bottom of the conductive structural element (the bottom is located at the second plane 13).

The regions of the photoresist layer may be of any shape or size. One or more conductive structural elements may be surrounded by a single photoresist layer.

According to an embodiment of the invention there may be provided a method (see FIG. 8) for estimating a thickness related to multiple conductive structural elements of an object, the method may include (a) step 810 of illuminating, with illuminating radiation, the multiple conductive structural elements and multiple photoresist layer portions that belong to a photoresist layer of the object; wherein the multiple photoresists layer portions surround the multiple conductive elements; (b) step 820 of detecting a first part of emitted radiation and a second part of emitted radiation, wherein the first part of the emitted radiation is emitted from upper surfaces of the multiple photoresists layer portions and is emitted from upper surfaces of the multiple conductive structural elements, wherein the second part of the emitted radiation is emitted from bottoms of the multiple photoresists layer portions; (c) step 830 of estimating, for each conductive structural element and based on the first part of the emitted radiation, a height difference between an upper surface of the conductive structural element and an upper surface of a photoresists layer portion that surrounds the conductive structural element, to provide multiple height differences; (d) step 840 of estimating thicknesses of the multiple photoresists layer portions, based at least on the second part of the emitted radiation; and (e) step 850 of calculating thickness values related to the multiple conductive structural elements, wherein the calculating may be based at least on the multiple height differences and on the estimated thickness of the multiple photoresists layer portions.

The illuminating radiation may be a white light.

The second part may be of lower intensity than the first part.

There may be provided a non-transitory computer readable medium for estimating a thickness related to multiple conductive structural elements of an object, the non-transitory computer readable medium may store instructions for: illuminating, with illuminating radiation, the multiple conductive structural elements and multiple photoresist layer portions that belong to a photoresist layer of the object; wherein the multiple photoresists layer portions surround the multiple conductive elements; detecting a first part of emitted radiation and a second part of emitted radiation, wherein the first part of the emitted radiation is emitted from upper surfaces of the multiple photoresists layer portions and is emitted from upper surfaces of the multiple conductive structural elements, wherein the second part of the emitted radiation is emitted from bottoms of the multiple photoresists layer portions; estimating, for each conductive structural element and based on the first part of the emitted radiation, a height difference between an upper surface of the conductive structural element and an upper surface of a photoresists layer portion that surrounds the conductive structural element, to provide multiple height differences; estimating thicknesses of the multiple photoresists layer portions, based at least on the second part of the emitted radiation; and calculating thickness values related to the multiple conductive structural elements, wherein the calculating may be based at least on the multiple height differences and on the estimated thickness of the multiple photoresists layer portions.

The illuminating radiation may be a white light.

There may be provided a measurement system that may include a measurement unit that is configured to: illuminate, with illuminating radiation, multiple conductive structural elements and multiple photoresist layer portions that belong to a photoresist layer of the object; wherein the multiple photoresists layer portions surround the multiple conductive elements; detect a first part of emitted radiation and a second part of emitted radiation, wherein the first part of the emitted radiation is emitted from upper surfaces of the multiple photoresists layer portions and is emitted from upper surfaces of the multiple conductive structural elements, wherein the second part of the emitted radiation is emitted from bottoms of the multiple photoresists layer portions; estimate, for each conductive structural element and based on the first part of the emitted radiation, a height difference between an upper surface of the conductive structural element and an upper surface of a photoresists layer portion that surrounds the conductive structural element, to provide multiple height differences; estimate thicknesses of the multiple photoresists layer portions, based at least on the second part of the emitted radiation; and a processing circuit that may be configured to calculate thickness values related to the multiple conductive structural elements, wherein the calculating may be based at least on the multiple height differences and on the estimated thickness of the multiple photoresists layer portions.

Each estimate may be executed by the processing circuit. The calculating of the thickness may be executed by the measurement unit.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The phrase "may be X" indicates that condition X may be fulfilled. This phrase also suggests that condition X may not be fulfilled. For example—any reference to a system as including a certain component should also cover the scenario in which the system does not include the certain component. For example—any reference to a method as including a certain step should also cover the scenario in which the method does not include the certain component. Yet for another example—any reference to a system that is configured to perform a certain operation should also cover the scenario in which the system is not configured to perform the certain operation.

The terms "including", "comprising", "having", "consisting" and "consisting essentially of" are used in an interchangeable manner. For example—any method may include at least the steps included in the figures and/or in the specification, only the steps included in the figures and/or the specification.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

Any system, apparatus or device referred to this patent application includes at least one hardware component.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for estimating a thickness related to multiple conductive structural elements of an object, the method comprises:
    (a) illuminating, with first illuminating radiation, the multiple conductive structural elements and multiple photoresist layer portions that belong to a photoresist layer of the object; wherein the multiple photoresists layer portions surround the multiple conductive elements;
    (b) detecting first emitted radiation, wherein the first emitted radiation is emitted from upper surfaces of the multiple photoresists layer portions and is emitted from upper surfaces of the multiple conductive structural elements;
    (c) estimating, for each conductive structural element and based on the first emitted radiation, a height difference between an upper surface of the conductive structural element and an upper surface of a photoresists layer portion that surrounds the conductive structural element, to provide multiple height differences;
    (d) illuminating with second illuminating radiation a first plurality of points of the photoresist layer portions; wherein the second illuminating radiation differs by at least wavelength from the first illuminating radiation;
    (e) detecting second emitted radiation that is emitted from at least bottoms of the multiple photoresists layer portions;
    (f) estimating thicknesses of the multiple photoresists layer portions, based at least on the second emitted radiation; and
    (g) calculating thickness values related to the multiple conductive structural elements, wherein the calculating is based at least on the multiple height differences and on the estimated thickness of the multiple photoresists layer portions.

2. The method according to claim 1 wherein the first illuminating radiation is an ultraviolet radiation.

3. The method according to claim 1 wherein the first illuminating radiation does not propagate through the photoresist layer and the second illumination radiation propagates through the photoresist layer.

4. The method according to claim 1 wherein steps (d), (e) and (f) executed by a reflectometer, and wherein steps (a), (c) and (c) are executed by a device that differs from the reflectometer.

5. The method according to claim 1 wherein steps (a), (b) and (c) are executed by a first process and steps (d), (e) and (f) are executed by a second process, wherein per measurement, the first process is faster than the second process.

6. The method according to claim 1 wherein the multiple conductive structural elements are a second plurality of conductive structural elements, and wherein the second plurality exceeds the first plurality.

7. The method according to claim 1 wherein at least one of the multiple photoresists layer portions does not include any of the first plurality of points.

8. The method according to claim 1 wherein the bottoms of the multiple photoresists layer portions, bottoms of the multiple conductive structural elements are located at a same plane, and wherein the thickness values related to the multiple conductive structural elements represent thickness of the entire multiple conductive structural elements.

9. The method according to claim 1 wherein the bottoms of the multiple photoresists layer portions are located at a first plane, bottoms of the multiple conductive structural elements are located at a second plane that differs from the first plane, and wherein the thickness values related to the multiple conductive structural elements represent thickness of parts of the multiple conductive structural elements.

10. A non-transitory computer readable medium for estimating a thickness related to multiple conductive structural elements of an object, the non-transitory computer readable medium stores instructions for:
  (a) illuminating, with first illuminating radiation, the multiple conductive structural elements and multiple photoresist layer portions that belong to a photoresist layer of the object; wherein the multiple photoresists layer portions surround the multiple conductive elements;
  (b) detecting first emitted radiation, wherein the first emitted radiation is emitted from upper surfaces of the multiple photoresists layer portions and is emitted from upper surfaces of the multiple conductive structural elements;
  (c) estimating, for each conductive structural element and based on the first emitted radiation, a height difference between an upper surface of the conductive structural element and an upper surface of a photoresists layer portion that surrounds the conductive structural element, to provide multiple height differences;
  (d) illuminating with second illuminating radiation a first plurality of points of the photoresist layer portions; wherein the second illuminating radiation differs by at least wavelength from the first illuminating radiation;
  (e) detecting second emitted radiation that is emitted from at least bottoms of the multiple photoresists layer portions;
  (f) estimating thicknesses of the multiple photoresists layer portions, based at least on the second emitted radiation; and
  (g) calculating thickness values related to the multiple conductive structural elements, wherein the calculating is based at least on the multiple height differences and on the estimated thickness of the multiple photoresists layer portions.

11. The non-transitory computer readable medium according to claim 10 wherein the first illuminating radiation is an ultraviolet radiation.

12. The non-transitory computer readable medium according to claim 10 wherein the first illuminating radiation does not propagate through the photoresist layer and the second illumination radiation propagates through the photoresist layer.

13. The non-transitory computer readable medium according to claim 10 wherein steps (d), (e) and (f) executed by a reflectometer, and wherein steps (a), (c) and (c) are executed by a device that differs from the reflectometer.

14. The non-transitory computer readable medium according to claim 10 wherein steps (a), (b) and (c) are executed by a first process and steps (d), (e) and (f) are executed by a second process, wherein per measurement, the first process is faster than the second process.

15. The non-transitory computer readable medium according to claim 10 wherein the multiple conductive structural elements are a second plurality of conductive structural elements, and wherein the second plurality exceeds the first plurality.

16. The non-transitory computer readable medium according to claim 10 wherein at least one of the multiple photoresists layer portions does not include any of the first plurality of points.

17. The non-transitory computer readable medium according to claim 10 wherein the bottoms of the multiple photoresists layer portions, bottoms of the multiple conductive structural elements are located at a same plane, and wherein the thickness values related to the multiple conductive structural elements represent thickness of the entire multiple conductive structural elements.

18. The non-transitory computer readable medium according to claim 10 wherein the bottoms of the multiple photoresists layer portions are located at a first plane, bottoms of the multiple conductive structural elements are located at a second plane that differs from the first plane, and wherein the thickness values related to the multiple conductive structural elements represent thickness of parts of the multiple conductive structural elements.

19. A measurement system that comprises:
  a first measurement unit that is configured to:
    illuminate, with first illuminating radiation, the multiple conductive structural elements and multiple photoresist layer portions that belong to a photoresist layer of the object; wherein the multiple photoresists layer portions surround the multiple conductive elements;
    detect first emitted radiation, wherein the first emitted radiation is emitted from upper surfaces of the multiple photoresists layer portions and is emitted from upper surfaces of the multiple conductive structural elements;
    estimate, for each conductive structural element and based on the first emitted radiation, a height difference between an upper surface of the conductive structural element and an upper surface of a photoresists layer portion that surrounds the conductive structural element, to provide multiple height differences;
  a second measurement unit that is configured to:
    illuminate with second illuminating radiation a first plurality of points of the photoresist layer portions; wherein the second illuminating radiation differs by at least wavelength from the first illuminating radiation;

detect second emitted radiation that is emitted from at least bottoms of the multiple photoresists layer portions; and estimate thicknesses of the multiple photoresists layer portions, based at least on the second emitted radiation; and a processing circuit that is configured to calculate thickness values related to the multiple conductive structural elements, wherein the calculating is based at least on the multiple height differences and on the estimated thickness of the multiple photoresists layer portions.

20. A method for estimating a thickness related to multiple conductive structural elements of an object, the method comprises:

illuminating, with illuminating radiation, the multiple conductive structural elements and multiple photoresist layer portions that belong to a photoresist layer of the object; wherein the multiple photoresists layer portions surround the multiple conductive elements;

detecting a first part of emitted radiation and a second part of emitted radiation, wherein the first part of the emitted radiation is emitted from upper surfaces of the multiple photoresists layer portions and is emitted from upper surfaces of the multiple conductive structural elements;

wherein the second part of the emitted radiation is emitted from bottoms of the multiple photoresists layer portions;

estimating, for each conductive structural element and based on the first part of the emitted radiation, a height difference between an upper surface of the conductive structural element and an upper surface of a photoresists layer portion that surrounds the conductive structural element, to provide multiple height differences;

estimating thicknesses of the multiple photoresists layer portions, based at least on the second part of the emitted radiation; and calculating thickness values related to the multiple conductive structural elements, wherein the calculating is based at least on the multiple height differences and on the estimated thickness of the multiple photoresists layer portions.

* * * * *